US00RE50982E

(19) United States
(12) Reissued Patent
Neusinger et al.

(10) Patent Number: US RE50,982 E
(45) Date of Reissued Patent: *Aug. 4, 2026

(54) APPARATUS, METHOD AND COMPUTER PROGRAM FOR UPMIXING A DOWNMIX AUDIO SIGNAL

(71) Applicant: Fraunhofer-Gesellschaft zur Foerderung der angewandten Forschung e.V., Munich (DE)

(72) Inventors: Matthias Neusinger, Rohr (DE); Julien Robilliard, Nuremberg (DE); Johannes Hilpert, Nuremberg (DE)

(73) Assignee: FRAUNHOFER-GESELLSCHAFT ZUR FOERDERUNG DER ANGEWANDTEN FORSCHUNG E.V., Munich (DE)

( * ) Notice: This patent is subject to a terminal disclaimer.

(21) Appl. No.: 19/028,584

(22) Filed: Jan. 17, 2025

Related U.S. Patent Documents

Reissue of:
(64) Patent No.: 8,867,753
Issued: Oct. 21, 2014
Appl. No.: 13/189,621
Filed: Jul. 25, 2011

U.S. Applications:
(63) Continuation of application No. PCT/EP2010/050279, filed on Jan. 12, 2010.
(Continued)

(30) Foreign Application Priority Data

May 27, 2009 (EP) ..... 09007086

(51) Int. Cl.
*H04R 5/00* (2006.01)
*G10L 19/008* (2013.01)

(52) U.S. Cl.
CPC ..... *G10L 19/008* (2013.01)

(58) Field of Classification Search
CPC ..... G10L 19/008
See application file for complete search history.

(56) References Cited

U.S. PATENT DOCUMENTS 5,577,159 A * 11/1996 Shoham ..... 704/206
7,974,847 B2 * 7/2011 Kjoerling et al. ..... 704/500
(Continued)

FOREIGN PATENT DOCUMENTS

RU 2323551 C1 4/2008
WO 2005/073958 A1 8/2005
(Continued)

OTHER PUBLICATIONS

Neusinger et al. "Apparatus, Method and Computer Program for Upmixing a Downmix Audio Signal", U.S. Appl. No. 13/189,621, filed Jul. 25, 2011.
(Continued)

*Primary Examiner* — Ovidio Escalante
(74) *Attorney, Agent, or Firm* — Keating & Bennett, LLP

(57) ABSTRACT

An apparatus for upmixing a downmix audio signal describing one or more downmix audio channels into an upmixed audio signal describing a plurality of upmixed audio channels includes an upmixer configured to apply temporally variable upmixing parameters to upmix the downmix audio signal in order to obtain the upmixed audio signal. The apparatus also includes a parameter interpolator, wherein the parameter interpolator is configured to obtain one or more temporally interpolated upmix parameters to be used by the upmixer on the basis of a first complex-valued upmix parameter and a subsequent second complex-valued upmix parameter. The parameter interpolator is configured to separately interpolate between a magnitude value of the first complex-valued upmix parameter and a magnitude value of the second complex-valued upmix parameter, and between a phase value of the first complex-valued upmix parameter
(Continued)

and a phase value of the second complex-valued upmix parameter, to obtain the one or more temporally interpolated upmix parameters. A respective method can be implemented, for example, as a computer program.

3 Claims, 8 Drawing Sheets

Related U.S. Application Data

(60) Provisional application No. 61/147,815, filed on Jan. 28, 2009.

(56) References Cited

U.S. PATENT DOCUMENTS

| | | | | |
|---|---|---|---|---|
| 8,983,834 | B2 | 3/2015 | Davis | |
| 2006/0136229 | A1 | 6/2006 | Kjoerling et al. | |
| 2007/0055510 | A1 | 3/2007 | Hilpert et al. | |
| 2007/0121954 | A1 | 5/2007 | Kim et al. | |
| 2007/0140499 | A1* | 6/2007 | Davis | G10L 19/018 381/23 |
| 2007/0189426 | A1 | 8/2007 | Kim et al. | |
| 2007/0280485 | A1* | 12/2007 | Villemoes | G10L 19/008 381/23 |
| 2008/0031463 | A1 | 2/2008 | Davis | |
| 2008/0039960 | A1 | 2/2008 | Kadir et al. | |
| 2008/0221907 | A1 | 9/2008 | Pang et al. | |

FOREIGN PATENT DOCUMENTS

| | | | |
|---|---|---|---|
| WO | 2006/058590 | A1 | 6/2006 |
| WO | 2007078254 | A2 | 7/2007 |
| WO | 2007110102 | A1 | 10/2007 |
| WO | 20071110102 | A1 | 10/2007 |

OTHER PUBLICATIONS

Neusinger et al. "Apparatus, Method and Computer Program for Upmixing a Downmix Audio Signal", U.S. Appl. No. 19/028,602, filed Jan. 17, 2025.
Neusinger et al. "Apparatus, Method and Computer Program for Upmixing a Downmix Audio Signal", U.S. Appl. No. 19/028,644, filed Jan. 17, 2025.
Neusinger et al. "Apparatus, Method and Computer Program for Upmixing a Downmix Audio Signal", U.S. Appl. No. 19/028,620, filed Jan. 17, 2025.
Neusinger et al. "Apparatus, Method and Computer Program for Upmixing a Downmix Audio Signal", U.S. Appl. No. 19/029,024, filed Jan. 17, 2025.
Neusinger et al. "Apparatus, Method and Computer Program for Upmixing a Downmix Audio Signal", U.S. Appl. No. 19/029,144, filed Jan. 17, 2025.
Neusinger et al. "Apparatus, Method and Computer Program for Upmixing a Downmix Audio Signal", U.S. Appl. No. 19/029,163, filed Jan. 17, 2025.
Neusinger et al. "Apparatus, Method and Computer Program for Upmixing a Downmix Audio Signal", U.S. Appl. No. 19/029,491, filed Jan. 17, 2025.
Neusinger et al. "Apparatus, Method and Computer Program for Upmixing a Downmix Audio Signal", U.S. Appl. No. 19/029,400, filed Jan. 17, 2025.
Neusinger et al. "Apparatus, Method and Computer Program for Upmixing a Downmix Audio Signal", U.S. Appl. No. 19/029,736, filed Jan. 17, 2025.
Faller et al., "Efficient Representation of Spatial Audio Using Perceptual Parametrization," IEEE WASPAA, Oct. 21-24, 2001, pp. 199-202.
Baumgarte et al., "Estimation of Auditory Spatial Cues for Binaural Cue Coding", IEEE ICASSP, May 2002, pp. 1801-1804.
Faller et al., "Binaural Cue Coding: A Novel and Efficient Representation of Spatial Audio," IEEE ICASSP, May 2002, pp. 1841-1844.
Faller et al., "Binaural Cue Coding Applied to Audio Compression with Flexible Rendering", AES 113th Convention, Oct. 5-8, 2002, pp. 1-10.
Breebaart et al., "High-Quality Parametric Spatial Audio Coding at Low Bitrates", AES 116th Convention, May 8-11, 2004, pp. 1-13.
Schuijers et al., "Low Complexity Parametric Stereo Coding", AES 116th Convention, May 8-11, 2004, pp. 1-11.
Breebaart et al., "Background, Concept, and Architecture for the Recent MPEG Surround Standard on Multichannel Audio Compression," Journal of the Audio Engineering Society, Audio Engineering Society, vol. 55, No. 5, May 1, 2007, pp. 331-351.
Official Communication issued in International Patent Application No. PCT/EP2010/050279, mailed on Apr. 19, 2010.
Faller et al., "Efficient Representation of Spatial Audio Using Perceptual Parametrization," IEEE WASPAA, Oct. 21-24, 2001, pp. 199-202, New Paltz, NY.
Baumgarte et al., "Estimation of Auditory Spatial Cues for Binaural Cue Coding", IEEE ICASSP, May 2002, pp. 1801-1804, Orlando, FL.
Faller et al., "Binaural Cue Coding: A Novel and Efficient Representation of Spatial Audio," IEEE ICASSP, May 2002, pp. 1841-1844, Orlando, FL.
Faller et al., "Binaural Cue Coding Applied to Audio Compression with Flexible Rendering", AES 113th Convention, Oct. 5-8, 2002, pp. 1-10, Los Angeles, CA.
Faller et al., "Binaural Cue Coding—Part II: Schemes and Applications," IEEE Transactions of Speech and Audio Processing, vol. 11, No. 6, Nov. 2003. pp. 520-531.
Breebaart et al., "High-Quality Parametric Spatial Audio Coding at Low Bitrates", AES 116th Convention, May 8-11, 2004, pp. 1-13, Berlin, Germany.
Schuijers et al., "Low Complexity Parametric Stereo Coding", AES 116th Convention, May 8-11, 2004, pp. 1-11, Berlin, Germany.
"Information Technology—MPEG Audio Technologies—Part 1: MPEG Surround," ISO/IEC FDIS 23003-1:2006(E), Jul. 21, 2006, pp. 1-289.
Breebaart et al., "Background, Concept, and Architecture for the Recent MPEG Surround Standard on Multichannel Audio Compression," Journal of the Audio Engineering Society, Audio Engineering Society, vol. 55, No. 5, May 1, 2007, pp. 331-351, New York, NY.

* cited by examiner $$|Z_{sep}| = \tfrac{1}{2}(|Z_1| + |Z_2|)$$

$$\varphi_{sep} = \tfrac{1}{2}\ \varphi_{12}$$

APPARATUS, METHOD AND COMPUTER PROGRAM FOR UPMIXING A DOWNMIX AUDIO SIGNAL

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

*Notice: More than one reissue application has been filed for the reissue of U.S. Pat. No. 8,867,753. The reissue applications are application Ser. No. 19/028,584 (the present application); and application Ser. Nos. 19/028,602; 19/028,620; 19/028,644; 19/029,024; 19/029,144; 19/029,163; 19/029,400; 19/029,491; and 19/029,736, each of which was filed on Jan. 17, 2025 and is a reissue application of U.S. Pat. No. 8,867,753.*

This application is a continuation of copending International Application No. PCT/EP2010/050279, filed Jan. 12, 2010, which is incorporated herein by reference in its entirety, and additionally claims priority from U.S. Application No. 61/147,815, filed Jan. 28, 2009, and EP Application 09007086.3, filed May 27, 2009, which are all incorporated herein by reference in their entirety.

BACKGROUND OF THE INVENTION

Embodiments according to the invention are related to an apparatus, a method, and a computer program for upmixing a downmix audio signal.

Some embodiments according to the invention are related to a magnitude-preserving upmix parameter interpolation for parametric multi-channel audio coding.

In the following, the context of the invention will be described. Recent development in the area of parametric audio coding delivers techniques for jointly coding a multi-channel audio (e.g. 5.1) signal into one (or more) downmix channels plus a side information stream. These techniques are known as Binaural Cue Coding, Parametric Stereo, and MPEG Surround etc.

A number of publications describe the so-called "Binaural Cue Coding" parametric multi-channel coding approach, see for example references [1][2][3][4][5].

"Parametric Stereo" is a related technique for the parametric coding of a two-channel stereo signal based on a transmitted mono signal plus parameter side information [6][7].

"MPEG Surround" is an ISO standard for parametric multi-channel coding [8].

The abovementioned techniques are based on transmitting the relevant perceptual cues for a human's spatial hearing in a compact form to the receiver together with the associated mono or stereo downmix-signal. Typical cues can be inter-channel level differences (ILD), inter-channel correlation or coherence (ICC), as well as inter-channel time differences (ITD) and inter-channel phase differences (IPD).

These parameters are in some cases transmitted in a frequency and time resolution adapted to the human's auditory resolution. The update interval in time is determined by the encoder, depending on the signal characteristics. This means that not for every sample of the downmix-signal, parameters are transmitted. In other words, in some cases a transmission rate (or transmission frequency, or update rate) of parameters describing the abovementioned cues may be smaller than a transmission rate (or transmission frequency, or update rate) of audio samples (or groups of audio samples).

Since the decoder may in some cases have to apply the parameters continuously over time in a gapless manner, e.g. to each sample (or audio sample), intermediate parameters may need to be derived at decoder side, typically by interpolation between past and current parameter sets.

Some conventional interpolation approaches, however, result in poor audio quality.

In the following, a generic binaural cue coding scheme will be described taking reference to FIG. 7. FIG. 7 shows a block schematic diagram of a binaural cue coding transmission system 800, which comprises a binaural cue coding encoder 810 and a binaural cue coding decoder 820. The binaural cue coding encoder 810 may for example receive a plurality of audio signals 812a, 812b, and 812c. Further, the binaural cue coding encoder 810 is configured to downmix the audio input signals 812a-812c using a downmixer 814 to obtain a downmix signal 816, which may for example be a sum signal, and which may be designated with "AS" or "X". Further, the binaural cue coding encoder 810 is configured to analyze the audio input signals 812a-812c using an analyzer 818 to obtain the side information signal 819 ("SI"). The sum signal 816 and the side information signal 819 are transmitted from the binaural cue coding encoder 810 to the binaural cue coding decoder 820. The binaural cue coding decoder 820 may be configured to synthesize a multi-channel audio output signal comprising, for example, audio channels y1, y2, . . . , yN on the basis of the sum signal 816 and inter-channel cues 824. For this purpose, the binaural cue coding decoder 820 may comprise a binaural cue coding synthesizer 822 which receives the sum signal 816 and the inter-channel cues 824, and provides the audio signals y1, y2, . . . , yN.

The binaural cue coding decoder 820 further comprises a side information processor 826 which is configured to receive the side information 819 and, optionally, a user input 827. The side information processor 826 is configured to provide the inter-channel cues 824 on the basis of the side information 819 and the optional user input 827.

To summarize, the audio input signals are analyzed and downmixed. The sum signal plus the side information is transmitted to the decoder. The inter-channel cues are generated from the side information and local user input. The binaural cue coding synthesis generates the multi-channel audio output signal.

For details, reference is made to the articles "Binaural Cue Coding Part II: Schemes and applications," by C. Faller and F. Baumgarte (published in: IEEE Transactions on Speech and Audio Processing, vol. 11, no. 6, November 2003).

However, it has been found that many conventional binaural cue coding decoders provide multi-channel output audio signals with degraded quality if the side information is received at a lower update frequency than the downmix signal.

In view of this problem, there is a need for an improved concept of upmixing a downmix audio signal into an upmixed audio signal, which reduces a degradation of the hearing impression if the update frequency of the side information is smaller than the update frequency of the downmix audio signal.

SUMMARY

According to an embodiment, an apparatus for upmixing a downmix audio signal describing one or more downmix audio channels into an upmixed audio signal describing a plurality of upmixed audio channels may have: an upmixer configured to apply temporally variable upmix parameters to upmix the downmix audio signal in order to obtain the upmixed audio signal; and a parameter interpolator, wherein the parameter interpolator is configured to obtain one or more temporally interpolated upmix parameters to be used by the upmixer on the basis of an information describing a first complex-valued upmix parameter and a subsequent second complex-valued upmix parameter, wherein the parameter interpolator is configured to separately interpolate (a) between a magnitude value of the first complex-valued upmix parameter and a magnitude value of the second complex-valued upmix parameter, and (b) between a phase value of the first complex-valued upmix parameter and a phase value of the second complex-valued upmix parameter, to obtain the one or more temporally interpolated complex-valued upmix parameters.

According to another embodiment, a method for upmixing a downmix audio signal describing one or more downmix audio channels into an upmixed audio signal describing a plurality of upmixed audio channels may have the steps of: obtaining one or more temporally interpolated complex-valued upmix parameters on the basis of a first complex-valued upmix parameter and a subsequent second complex-valued upmix parameter, wherein the interpolation is performed separately (a) between a magnitude value of the first complex-valued upmix parameter and a magnitude value of the second complex-valued upmix parameter, and (b) between a phase value of the first complex-valued upmix parameter and a phase value of the second complex-valued upmix parameter; and applying the interpolated complex-valued upmix parameters to upmix the downmix audio signal, in order to obtain the upmixed audio signal.

Another embodiment may have a computer program for performing the inventive method, when the computer program runs on a computer.

An embodiment according to the invention creates an apparatus for upmixing a downmix audio signal describing one or more downmix audio channels into an upmixed audio channel describing a plurality of upmixed audio channels. The apparatus comprises an upmixer configured to apply temporally variable upmixing parameters to upmix the downmix audio signal in order to obtain the upmixed audio signal. The apparatus further comprises a parameter interpolator, wherein the parameter interpolator is configured to obtain one or more temporally interpolated upmix parameters to be used by the upmixer on the basis of a first complex-valued upmix parameter and a subsequent second complex-valued upmix parameter. The parameter interpolator is configured to separately interpolate between a magnitude value of the first complex-valued upmix parameter and a magnitude value of the second complex-valued upmix parameter, and between a phase value of the first complex-valued upmix parameter and a phase value of the second complex-valued upmix parameter, to obtain the one or more temporally interpolated upmix parameters.

Embodiments according to the invention are based on the finding that a separate temporal interpolation of the magnitude value of an upmix parameter and of the phase value of the upmix parameter brings along a good hearing impression of the upmixed audio signal because a variation of the magnitude of the interpolated upmix parameter is kept very small. It has been found that an unnecessarily large variation of the amplitude of the upmix parameter may result in an audible and disturbing modulation of the upmixed audio signal. In contrast, by separately interpolating the amplitude of the complex-valued upmix parameters from the phase value thereof, the amplitude variation caused by the interpolation is kept small (or even minimized), even in the presence of a large phase difference between the complex value of the first (or initial) upmix parameter and the complex value of the second (or subsequent) upmix parameter. Accordingly, an audible and disturbing modulation of the upmixed output audio signal is reduced when compared to some other types of interpolation (or even completely eliminated).

Thus, a good hearing impression of the upmixed output audio signal can be obtained, even if the side information is transferred from a binaural cue coding encoder to a binaural cue coding decoder less frequently than samples of the downmix audio signal.

In an embodiment according to the invention, the parameter interpolator is configured to monotonically time interpolate between a magnitude value of the first complex-valued upmix parameter and the magnitude value of the second (subsequent) complex-valued upmix parameter to obtain magnitude values of the one or more temporally interpolated upmix parameters. Furthermore, the parameter interpolator may be configured to linearly time-interpolate between a phase value of the first complex-valued upmix parameter and the phase value of the second complex-valued upmix parameter, to obtain phase values of the one or more temporally interpolated upmix parameters. Further, the parameter interpolator may be configured to combine the one or more magnitude values of the interpolated upmix parameters with corresponding phase values of the interpolated upmix parameters in order to obtain the one or more complex-valued interpolated upmix parameters.

In an embodiment according to the invention, the parameter interpolator is configured to linearly time-interpolate between the magnitude value of the first complex-valued upmix parameter and the magnitude value of the second, subsequent complex-valued upmix parameter, to obtain magnitude values of the one or more temporally interpolated upmix parameters.

By performing a monotonic or even linear time interpolation between magnitude values of the subsequent complex-valued upmix parameters, a disturbing amplitude modulation of the upmixed audio signal (which would be caused by other interpolation schemes) can be avoided. Regarding this issue, it has been found that the human auditory system is particularly sensitive to amplitude modulation of audio signals. It has also been found that the auditory impression (or hearing impression) is significantly degraded by such a parasitic amplitude modulation. Accordingly, obtaining a smooth and non-modulated variation of the upmix parameters, which results in a smooth and non-modulated temporal evolution of the audio signal amplitude, is an important contribution to the improvement of the hearing impression of an upmix signal in the presence of an interpolation of the upmix parameters.

In an embodiment of the invention, the upmixer is configured to perform a linear scaled superposition of complex-valued subband parameters of a plurality of upmixer audio input signals in dependence on the complex-valued interpolated upmixing parameters to obtain the upmixed audio signal. In this case, the upmixer may be configured to process sequences of subband parameters representing subsequent audio samples of the upmixer audio input signals. The parameter interpolator may be configured to receive subsequent complex-valued upmix parameters, which are temporally spaced by more than the duration of one of the subband audio samples, and to update the interpolated upmixing parameters more frequently (e.g. once per subband audio sample).

Thus, the upmixer may be configured to receive updated samples of the upmixer audio input signals at an upmixer update rate, and the parameter interpolator may be configured to update the interpolated upmix parameters at the upmixer update rate. In this way, the update rate of the upmix parameters may be adapted to be the update rate of the upmixer audio input signals. Accordingly, particularly smooth transitions between two subsequent sets of upmix-parameters received by the apparatus (e.g. at an update rate smaller than the upmixer update rate) may be obtained.

In an embodiment of the invention, the upmixer may be configured to perform a matrix-vector multiplication using a matrix comprising the interpolated upmix parameters and a vector comprising one or more subband parameters of the upmixer audio input signals, to obtain as a result a vector comprising complex-valued subband samples of the upmixed audio signals. By using a matrix-vector multiplication, a particularly efficient circuit implementation can be obtained. The matrix-vector multiplication defines, in an efficient-to-implement form, the upmix-parameter-dependent linear superposition of the audio input signals. A matrix-vector-multiplication can be efficiently implemented in a signal processor (or in other appropriate hardware or software units) if the entries of the matrix are represented split-up into a real part and an imaginary part. Handling of complex values split-up into a real part and an imaginary part can be performed with relatively little effort, as the real-part/imaginar-part splitting is well-suited both for a multiplication of complex numbers and, particularly, for an addition of the results of the multiplication. Thus, while other number representations bring along severe difficulties either with respect to a multiplication or with respect to an addition (which operations are both needed in a matrix-vector-multiplication), the usage of a real-part/imaginary-part number representation provides for an efficient solution.

In an embodiment of the invention, the apparatus is configured to receive spatial cues describing the upmix parameters. In this case, the parameter interpolator may be configured to determine the magnitude values of the upmix parameters in dependence on inter-channel level difference parameters, or in dependence on inter-channel correlation (or coherence) parameters, or in dependence on inter-channel level difference parameters and inter-channel correlation (or coherence) parameters. Further, the parameter interpolator may be configured to determine the phase values of the upmix parameters in dependence on inter-channel phase difference parameters. Accordingly, it can be seen that in some cases it is possible, in a very efficient manner, to obtain the magnitude values and the phase values of the upmix parameters separately. Thus, the input information necessitated for the separate interpolation can be efficiently obtained even without any additional magnitude-value/phase values separation unit if the abovementioned parameters (ILD, ICC, IPD, and/or ITD) or comparable parameters are used as input quantities to the parameter interpolator.

In an embodiment of the invention, the parameter interpolator is configured to determine a direction of the interpolation between the phase values of subsequent complex-valued upmix parameters such that an angle range passed in the interpolation between a phase value of the first complex-valued upmix parameter and a phase value of the (subsequent) second complex-valued upmix parameter is smaller than, or equal to, 180°. In other words, in some embodiments it is ensured that a phase variation caused by the interpolation is kept sufficiently small (or even minimized). Even though the human auditory perception is not particularly sensitive to phase changes, it may be advantageous to limit the phase variation. For example, fast phase variation of the upmix parameters might result in difficult-to-predict distortions such as frequency shifts or frequency modulation. Such distortions can be limited or eliminated by carefully deciding how to interpolate the phase values of the upmix parameters.

Another embodiment according to the invention creates a method for upmixing a downmix audio signal.

Yet another embodiment according to the invention creates a computer program for upmixing a downmix audio signal.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
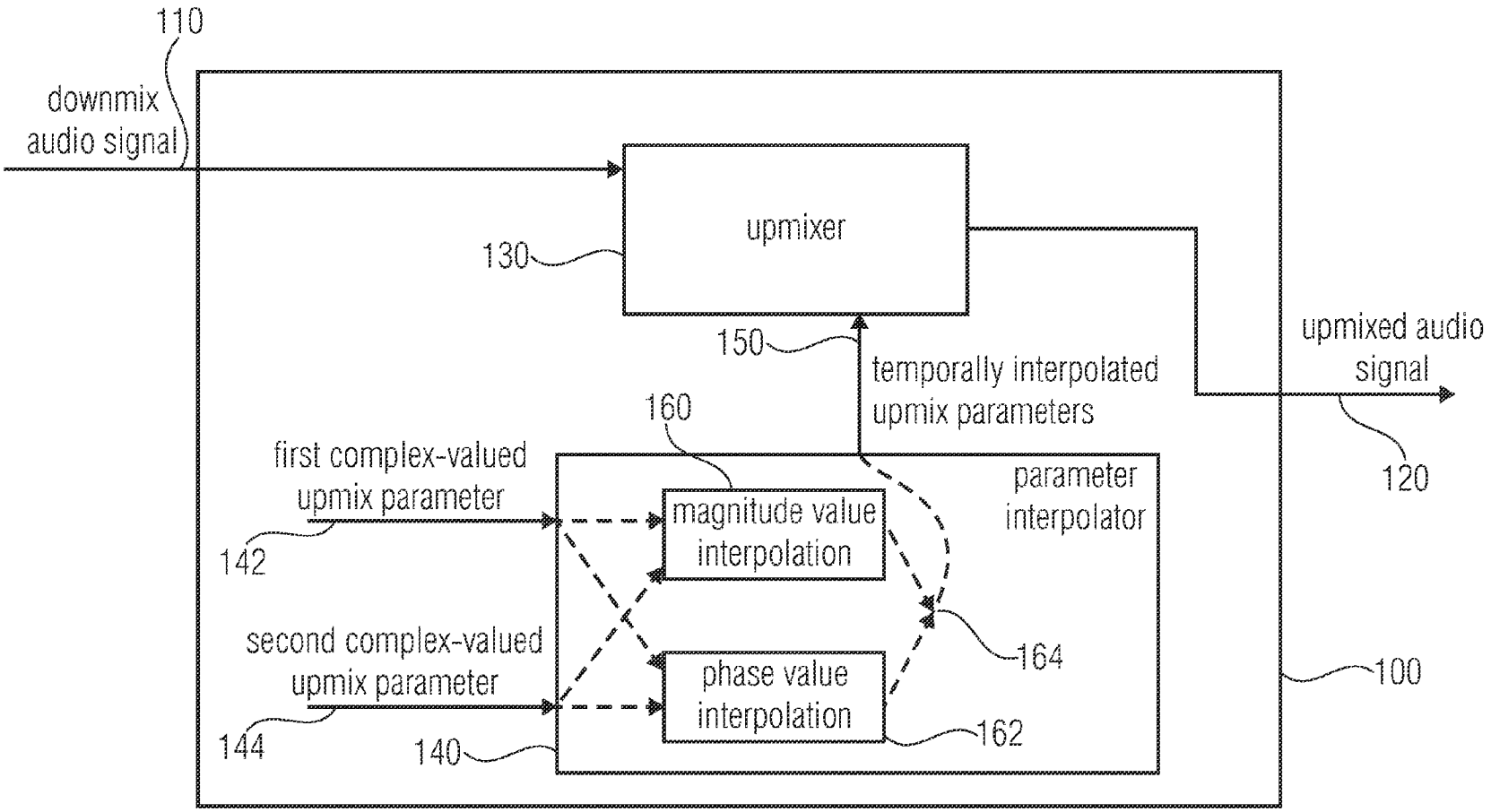
FIG. 1 shows a block schematic diagram of an apparatus for upmixing a downmix audio signal, according to an embodiment of the invention.

Embodiment According to FIG. 1

FIG. 1 shows a block schematic diagram of an apparatus 100 for upmixing a downmix audio signal, according to an embodiment of the invention. The apparatus 100 is configured to receive a downmix audio signal 110 describing one or more downmix audio channels, and to provide an upmixed audio signal 120 describing a plurality of upmixed audio channels. The apparatus 100 comprises an upmixer 130 configured to apply temporally variable upmixing parameters to upmix the downmix audio signal 110 in order to obtain the upmixed audio signal 120. The apparatus 100 also comprises a parameter interpolator 140 configured to receive a sequence of complex-valued upmix parameters, for example a first complex-valued upmix parameter 142 and a subsequent second complex-valued upmix parameter 144. The parameter interpolator 140 is configured to obtain one or more temporally interpolated upmix parameters 150 to be used by the upmixer 130 on the basis of the first (or initial) complex-valued upmix parameter 142 and the second, subsequent complex-valued upmix parameter 144. The parameter interpolator 140 is configured to separately interpolate between a magnitude value of the first complex-valued upmix parameter 142 and a magnitude value of the second complex-valued upmix parameter 144 (which magnitude value interpolation is represented at reference numeral 160), and between a phase value of the first complex-valued upmix parameter 142 and a phase value of the second complex-valued upmix parameter 144 (which phase value interpolation is represented at reference numeral 162). The parameter interpolator 140 is configured to obtain the one or more temporally interpolated upmix parameters 150 on the basis of the interpolated magnitude values (also designated as amplitude values, or gain values)(which is represented with reference numeral 160) and on the basis of the interpolated phase values (also designated as angle values)(which is shown at reference numeral 164).

In the following, some details regarding the functionality of the apparatus 100 will be described. The downmix audio signal 110 may be input into the upmixer 130, for example in the form of a sequence of sets of complex values representing the downmix audio signal in the time-frequency domain (describing overlapping or non-overlapping frequency bands or frequency subbands at an update rate determined by the encoder not shown here). The upmixer 130 is configured to linearly combine multiple channels of the downmix audio signal 110 in dependence on the temporally interpolated upmix parameters 150, or to linearly combine a channel of the downmix audio signal 110 with an auxiliary signal (e.g. de-correlated signal) (wherein the auxiliary signal may be derived from the same audio channel of the downmix audio signal 110, from one or more other audio channels of the downmix audio signal 110 or from a combination of audio channels of the downmix audio signal 110). Thus, the temporally interpolated upmix parameters 150 may be used by the upmixer 130 to decide upon the amplitude scaling and a phase rotation (or time delay) used in the generation of the upmixed audio signal 120 (or a channel thereof) on the basis of the downmix audio signal 110.

The parameter interpolator 140 is typically configured to provide temporally interpolated upmix parameters 150 at an update rate which is higher than the update rate of the side information described by the upmix parameters 142, 144. For this purpose, subsequent complex-valued upmix parameter are obtained (e.g. received or computed) by the parameter interpolator 140. A magnitude value and a phase value of the complex-valued upmix parameters 142, 144 are separately (or even independently) processed using a magnitude value interpolation 160 and a phase value interpolation 162. Thus, temporally interpolated magnitude values of the upmix parameters and temporally interpolated phase values of the upmix parameters are available separately, and may either be fed separately to the upmixer 140, or may be fed to the upmixer 130 in a combined form (combined—after separate interpolation—into a complex-valued number). The separate interpolation brings along the advantage that an amplitude of the temporally interpolated upmix parameter typically comprises a smooth and monotonic temporal evolution between subsequent instances in time at which the updated side information is received by the apparatus 100. Audible and disturbing artifacts, such as an amplitude modulation of one or more subbands, which are caused by other types of interpolation, are avoided. Accordingly, the quality of the updated audio signals 120 is superior to the quality of an upmix signal which would be obtained using conventional types of upmix parameter interpolation.

Embodiment According to FIG. 2

Figure 2A:
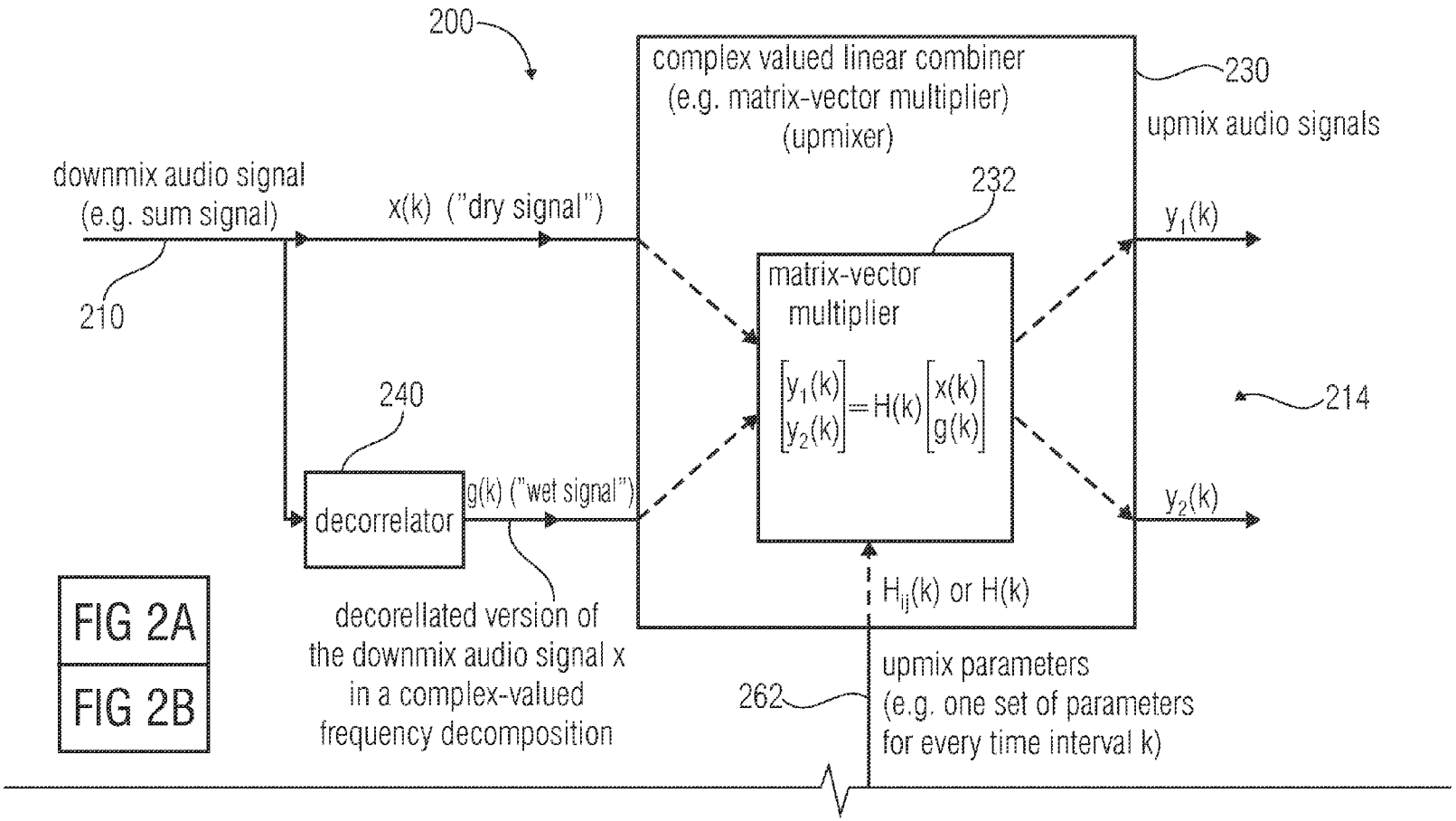
FIGS. 2a and 2b show a block schematic diagram of an apparatus for upmixing a downmix audio signal, according to another embodiment of the invention.
Figure 2B:
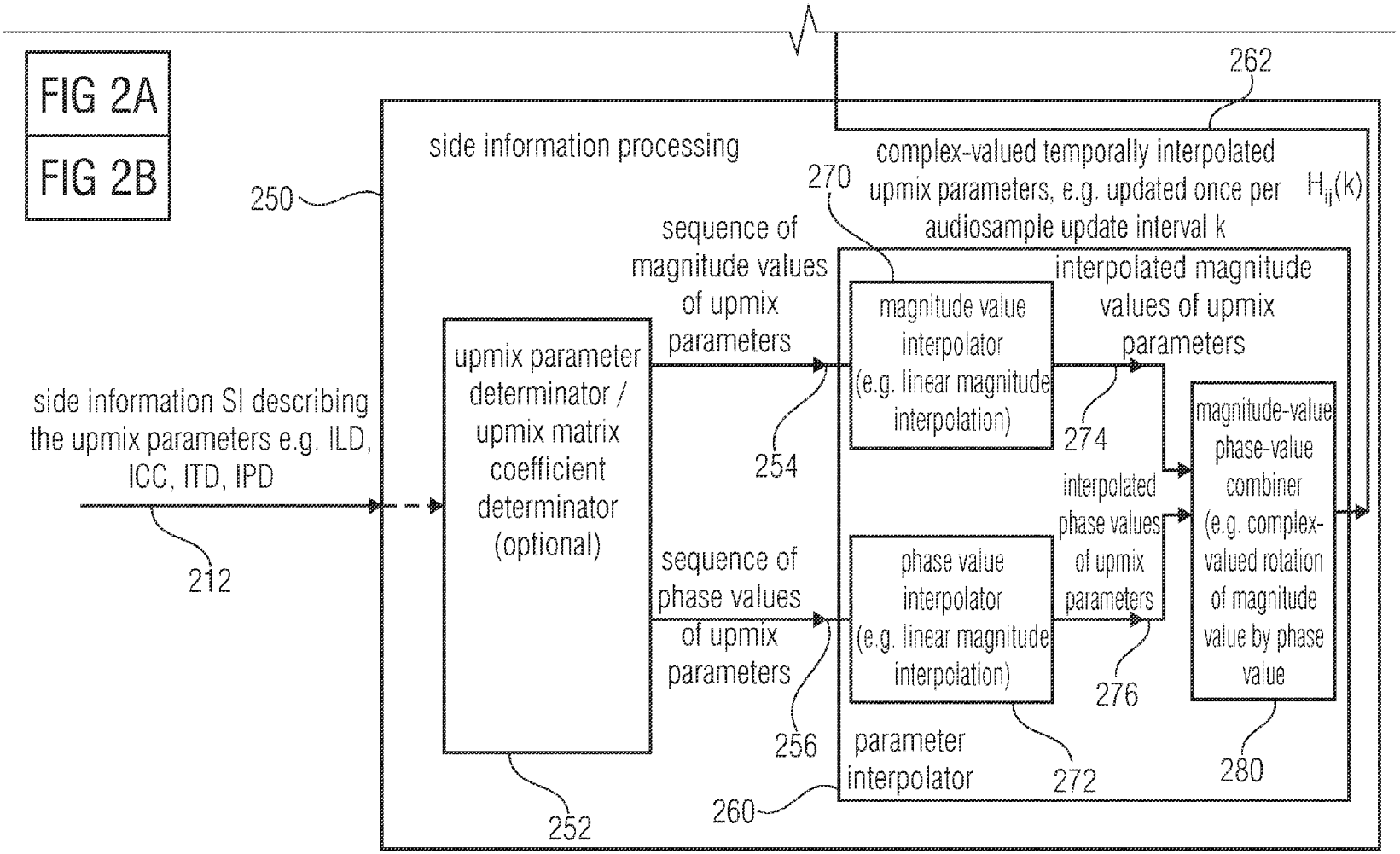

Further details regarding the structure and operation of an apparatus for upmixing an audio signal will be described taking reference to FIGS. 2a and 2b. FIGS. 2a and 2b show a detailed block schematic diagram of an apparatus 200 for upmixing a downmix audio signal, according to another embodiment of the invention. The apparatus 200 can be considered as a decoder for generating a multi-channel (e.g. 5.1) audio signal on the basis of a downmix audio signal and a side information SI. The apparatus 200 implements the functionalities which have been described with respect to the apparatus 100. The apparatus 200 may, for example, serve to decode a multi-channel audio signal encoded according to a so-called "binaural cue coding", a so-called "parametric stereo", or a so-called "MPEG Surround". Naturally, the apparatus 200 may similarly be used to upmix multi-channel audio signals encoded according to other systems using spatial cues.

For simplicity, the apparatus 200 is described which performs an upmix of a single channel downmix audio signal into a two-channel signal. However, the concept described here can be easily extended to cases in which the downmix audio signal comprises more than one channel, and also to cases in which the upmixed audio signal comprises more than two channels.

Input Signals and Input Timing

The apparatus 200 is configured to receive the downmix audio signal 210 and the side information 212. Further, the apparatus 200 is configured to provide an upmixed audio signal 214 comprising, for example, multiple channels.

Figure 7:
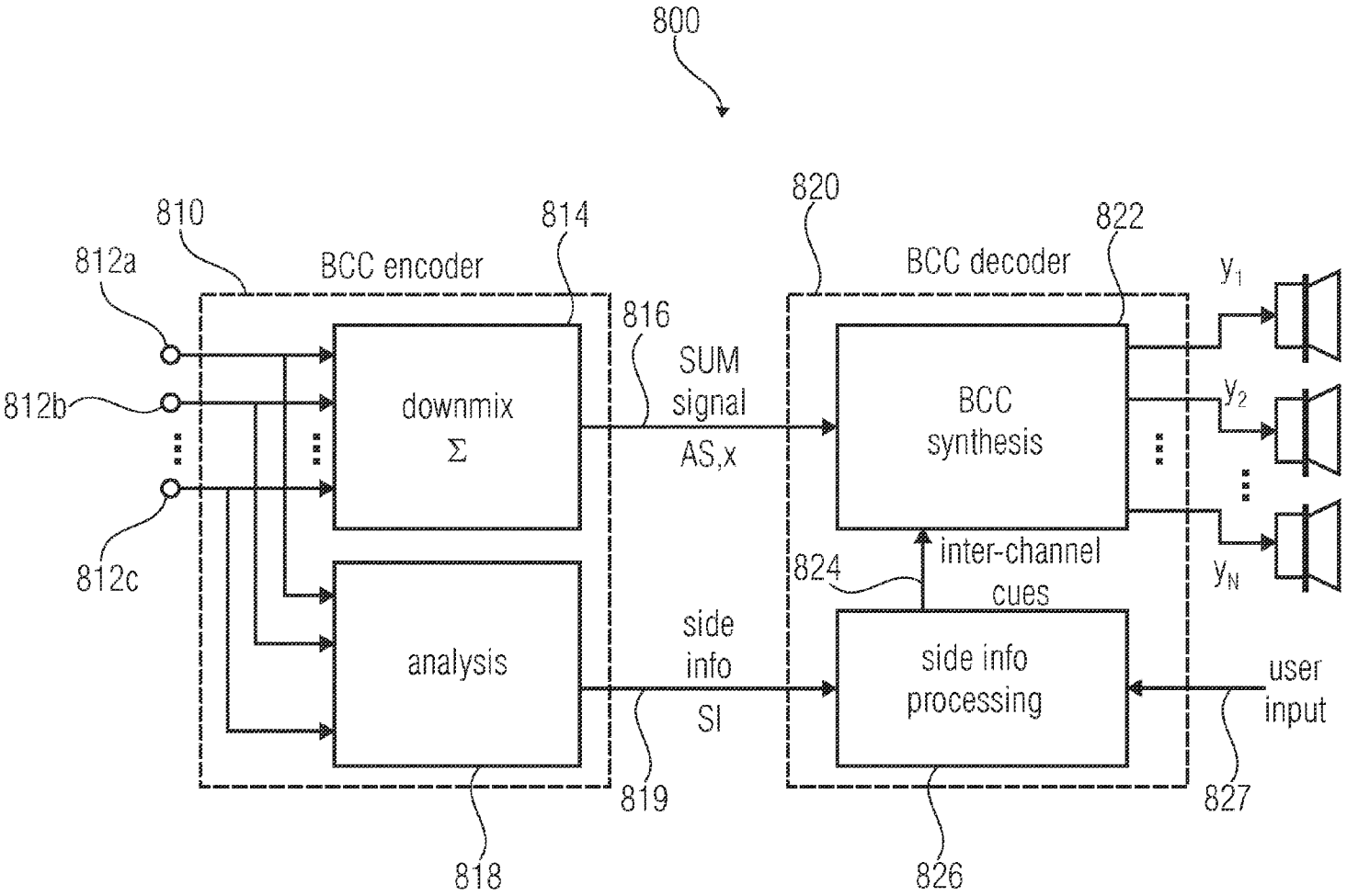
FIG. 7 shows a block schematic diagram representing a generic binaural cue coding scheme.

The downmix audio signal 210 may, for example, be a sum signal generated by an encoder (e.g. by the BCC encoder 810 shown in FIG. 7). The downmix audio signal 210 may, for instance, be represented in a time-frequency domain, for example in the form of a complex-valued frequency decomposition. For instance, audio contents of a plurality of frequency subbands (which may be overlapping or non-overlapping) of the audio signal may be represented by corresponding complex values. For a given frequency band, the downmix audio signal may be represented by a sequence of complex values describing the audio content in the frequency subband under consideration for subsequent (overlapping or non-overlapping) time intervals. The subsequent complex values for subsequent time intervals may be obtained, for example, using a filterbank (e.g. QMF Filterbank), a Fast Fourier Transform, or the like, in the apparatus 100 (which may be part of a multi-channel audio signal decoder), or in an additional device coupled to the apparatus 100. However, the representation of the downmix audio signal described here is typically not identical to the representation of the downmix signal used for a transmission of the downmix audio signal from a multi-channel audio signal encoder to a multi-channel audio signal decoder, or to the apparatus 100. Accordingly, the downmix audio signal 210 may be represented by a stream of sets or vectors of complex values.

In the following, it will be assumed that subsequent time intervals of the downmix audio signal 210 are designated with an integer-valued index k. It will also be assumed that the apparatus 200 receives one set or vector of complex values per interval k and per channel of the downmix audio signal 210. Thus, one sample (set or vector of complex values) is received for every audio sample update interval described by time index k.

Figure 3:
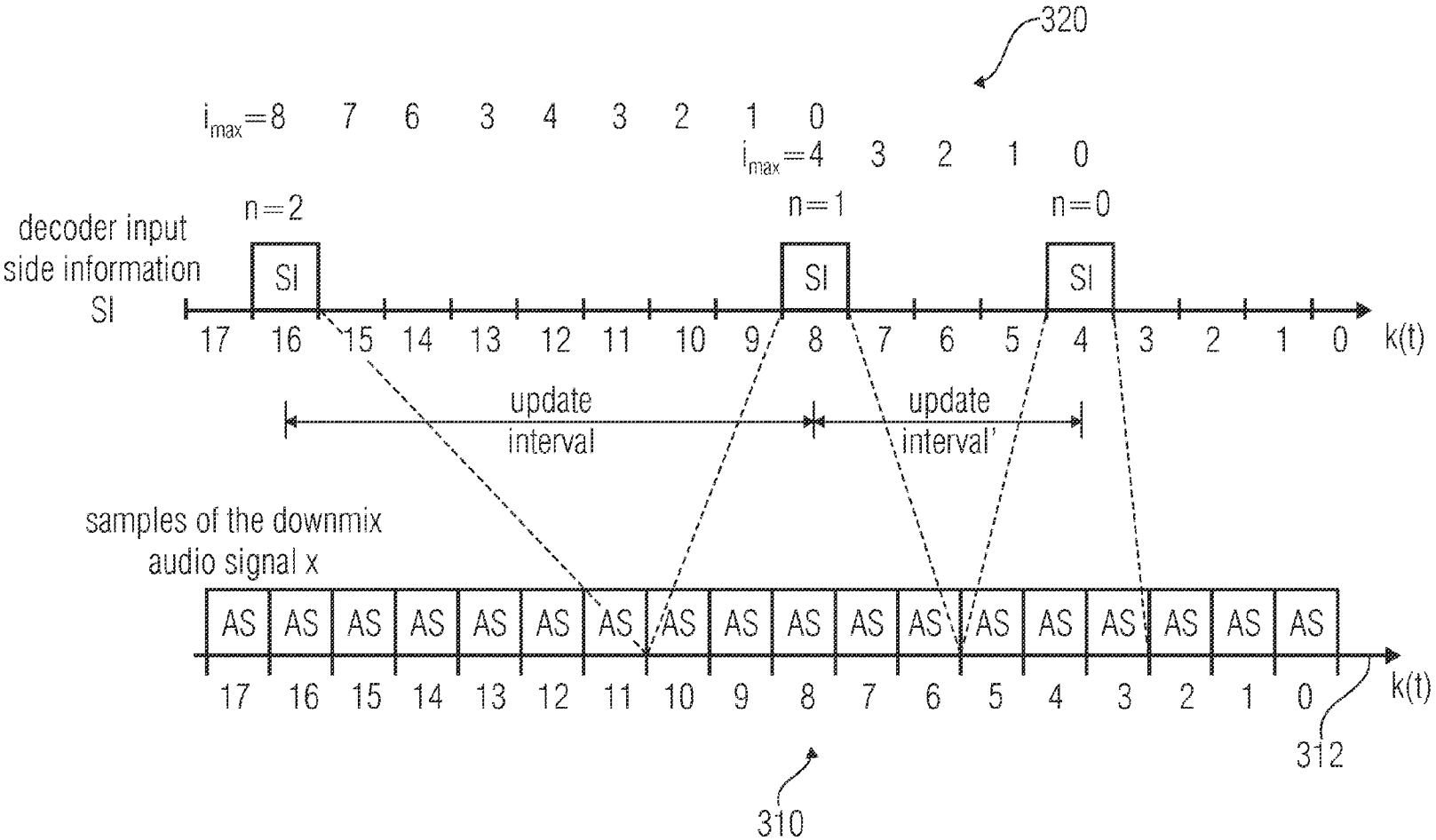
FIG. 3 shows a schematic representation of a timing relationship between samples of the downmix audio signal and a decoder input side information.

To facilitate the understanding, FIG. 3 shows a graphical representation of a timing relationship between samples of the downmix audio signal 210 ("x") and the corresponding decoder side information 212 ("SI"). Audio samples ("AS") of the downmixed audio signal 210 received by the apparatus 200 over time are shown at reference numeral 310. As can be seen from the graphical representation 310, a single audio sample AS is associated with each audio sample update interval k, as described above.

The apparatus 200 further receives a side information 212 describing the upmix parameters. For instance, the side information 212 may describe one or more of the following upmix parameters: inter-channel level difference (ILD), inter-channel correlation (or coherence) (ICC), inter-channel time difference (ITD), and inter-channel phase difference (IPD). Typically, the side information 212 comprises the ILD parameters and at least one out of the parameters ICC, ITD, IPD. However, in order to save bandwidth, the side information 212 is typically only transmitted towards, or received by, the apparatus 200 once per multiple of the audio sample update intervals k of the downmix audio signal 210 (or the transmission of a single set of side information may be temporally spread over a plurality of audio sample update intervals k). Thus, there is typically only one set of side information parameters for a plurality of audio sample update intervals k.

This timing relationship is shown in FIG. 3. For example, side information is transmitted to (or received by) the apparatus 200 at the audio sample update intervals k=4, k=8, and k=16, as can be seen at reference numeral 320. In contrast no side information 212 is transmitted to (or received by) the apparatus 200 between said audio sample update intervals.

As can be seen from FIG. 3, the update intervals of the side information 212 may vary over time, as the encoder may for example decide to provide a side information update only when necessitated (e.g. when the decoder recognizes that the side information is changed by more than a predetermined value). For example, the side information received by the apparatus 200 for the audio sample update interval k=4 may be associated with the audio sample update intervals k=3, 4, 5. Similarly, the side information received by the apparatus 200 for the audio sample update interval k=8 may be associated with the audio sample update intervals k=6, 7, 8, 9, 10, and so on. However, a different association is naturally possible, and the update intervals for the side information may naturally also be larger or smaller than shown in FIG. 3.

Output Signals and Output Timing

However, the apparatus 200 serves to provide upmixed audio signals in a complex-valued frequency composition. For example, the apparatus 200 may be configured to provide the upmixed audio signals 214 such that the upmixed audio signals comprise the same audio sample update interval or audio signal update rate as the downmix audio signal 210. In other words, for each sample (or audio sample update interval k) of the downmix audio signal 210, a sample of the upmixed audio signal 214 is generated.

Upmix

In the following, it will be described in detail how an update of the upmix parameters, which are used for upmixing the downmix audio signal, can be obtained for each audio sample update interval k, even though the decoder input side information is updated only in larger update intervals (as shown in FIG. 3). In the following the processing for a single subband will be described, but the concept can naturally be extended to multiple subbands.

The apparatus 200 comprises, as a key component, an upmixer which is configured to operate as a complex-valued linear combiner. The upmixer 230 is configured to receive a sample x(k) of the downmix audio signal 210 (e.g. representing a certain frequency band) associated with the audio sample update interval k. The signal x(k) is sometimes also designated as "dry signal". Also, the upmixer is configured to receive samples representing a decorrelated version of the downmix audio signal.

Further, the apparatus 200 comprises a decorrelator (e.g. a delayer or reverberator) 240, which is configured to receive samples x(k) of the downmix audio signal and to provide, on the basis thereof, samples q(k) of a de-correlated version of the downmix audio signal (represented by x(k)). The de-correlated version (samples q(k)) of the downmix audio signal (samples x(k)) may be designated as "wet signal".

The upmixer 230 comprises, for example, a matrix-vector multiplier 232 which is configured to perform a complex-valued linear combination of the "dry signal" (x(k)) and the "wet signal" (q(k)) to obtain a first upmixed channel signal (represented by samples $y_1(k)$) and a second upmixed channel signal (represented by samples $y_2(k)$). The matrix-vector multiplier 232 may, for example, be configured to perform the following matrix-vector multiplication to obtain the samples $y_1(k)$ and $y_2(k)$ of the upmixed channel signals:

$$\begin{bmatrix} y_1(k) \\ y_2(k) \end{bmatrix} = H(k) \begin{bmatrix} x(k) \\ q(k) \end{bmatrix}$$

Update of the Upmix Parameters

As can be seen from the above equation, it is desirable to update the upmix parameter matrix H(k) for each audio sample update interval k. Updating the upmix parameter matrix for each audio sample update interval k brings along the advantage that the upmix parameter matrix is well-adapted to the actual acoustic environment. Updating the upmix parameter matrix for every audio sample update interval k also allows keeping step-wise changes of the upmix parameter matrix H (or of the entries thereof) between subsequent audio sample intervals small, as changes of the upmix parameter matrix are distributed over multiple audio sample update intervals, even if the side information 212 is updated only once per multiple of the audio sample update intervals k.

The apparatus 200 comprises a side information processing unit 250, which is configured to provide the upmix parameters, for instance, the entries $H_{ij}(k)$, on the basis of the side information 212. The side information processing unit 250 is configured to provide an updated set of upmix parameters for every audio sample interval k, even if the side information 212 is updated only once per multiple audio sample update intervals k.

The side information processing unit 250 comprises an upmix parameter determinator (or upmix matrix coefficient determinator) 252, which is configured to receive the side information 212 and to derive, on the basis thereof, one or more upmix parameters (or, equivalently, upmix matrix coefficients). For example, the upmix parameter determinator 252 may combine a plurality of cues (e.g. ILD, ICC, ITD, IPD) to obtain the upmix parameters. The upmix parameter determinator 252 is configured to describe the upmix parameters in the form of a magnitude value and a separate phase value. The magnitude value may for example represent an absolute value of a complex number, and the phase value may represent an angle value of the complex number (measured, for example, with respect to a real-part-axis in a real-part-imaginary-part orthogonal coordinate system).

Thus, the upmix parameter determinator may provide a sequence 254 of magnitude values of upmix parameters and a sequence 256 of phase values of upmix parameters. The upmix parameter determinator 252 may be configured to derive from one set of side information, a complete set of upmix parameters (or a complete set of matrix elements of the matrix H). There may be an association between a set of side information 212 and a set of upmix parameters (or a set of matrix elements). Accordingly, the upmix parameter determinator 252 may be configured to update the upmix parameters 254, 256 (or matrix elements) once per upmix parameter update interval, i.e. once per update of the set of side information.

The side information processing unit further comprises a parameter interpolator 260, which will be described in detail in the following. The parameter interpolator 260 is configured to receive the sequence 254 of (real-valued) magnitude values of upmix parameters (or matrix elements) and the sequence 256 of (real-valued) phase values of upmix parameters (or matrix elements). Further, the parameter interpolator is configured to provide a sequence of complex-valued, temporally interpolated upmix parameters (or matrix elements) 262 on the basis of an interpolation and combination of the sequence 254 and the sequence 256.

The parameter interpolator 260 comprises a magnitude value interpolator 270 and a phase value interpolator 272. In addition, the parameter interpolator comprises a magnitude-value/phase-value combiner 280.

The magnitude-value interpolator 270 is configured to receive the sequence 254 and to provide, on the basis thereof, a sequence 274 of interpolated magnitude values of upmix parameters (or of matrix elements). The magnitude value interpolator 270 may, for example, be configured to perform a linear magnitude interpolation between subsequent magnitude values of the sequence 254. Thus, while the sequence 254 is updated (i.e. comprises a new magnitude value of a specific upmix parameter or matrix element) once per upmix parameter update interval, the sequence 274 is updated more often, for example once per audio sample update interval k (wherein the upmix parameter update interval is typically larger than the audio sample update interval k).

Similarly, the phase value interpolator 272 is configured to receive the sequence 256 and to provide, on the basis thereof, a sequence 276 of interpolated phase values of upmix parameters (or of matrix elements). The phase value interpolator 272 may, for example, be configured to perform a linear phase interpolation between subsequent phase values of the sequence 256. Thus, the sequence 276 is updated once per audio sample update interval k, while the sequence 256 is updated once per upmix parameter update interval.

Importantly, the magnitude value interpolator 270 and the phase value interpolator 272 are configured to perform the magnitude interpolation and the phase interpolation separately or independently. Thus, the magnitude values of the sequence 254 do not affect the phase value interpolation, and the phase values of the sequence 256 do not affect the magnitude interpolation. However, it is assumed that the magnitude value interpolator and the phase value interpolator operate in a time-synchronized manner such that the sequences 274, 276 comprise corresponding pairs of interpolated magnitude values and interpolated phase values of upmix parameters (or matrix elements).

The magnitude value/phase value combiner 280 is configured to receive both the sequence 274 of interpolated magnitude values and the sequence 276 of interpolated phase values. The magnitude value/phase value combiner 280 is further configured to provide the sequence 262 of complex-valued interpolated upmix parameters or matrix elements by combining the interpolated magnitude values of the sequence 274 with corresponding interpolated phase values of the sequence 276. For example, the magnitude value/phase value combiner 280 is configured to perform a complex-valued rotation of an interpolated magnitude value of the sequence 274 by an angle determined by a corresponding interpolated phase value of the sequence 276. Generally speaking, the magnitude value/phase value combiner may provide a complex number, the magnitude of which is determined by an interpolated magnitude value and the phase of which is determined by a corresponding interpolated phase value.

Naturally, the parameter interpolator 260 may act separately on different upmix parameters or matrix elements. Thus, the parameter interpolator 260 may receive one sequence 254 of magnitude values and a corresponding sequence 256 of phase values for each upmix parameter (out of a plurality of upmix parameters) or matrix element of the matrix H. Thus, the parameter interpolator may provide one sequence 262 of temporally-interpolated complex values for each upmix parameter matrix elements.

Interpolation Timing Relationship

Figure 4:
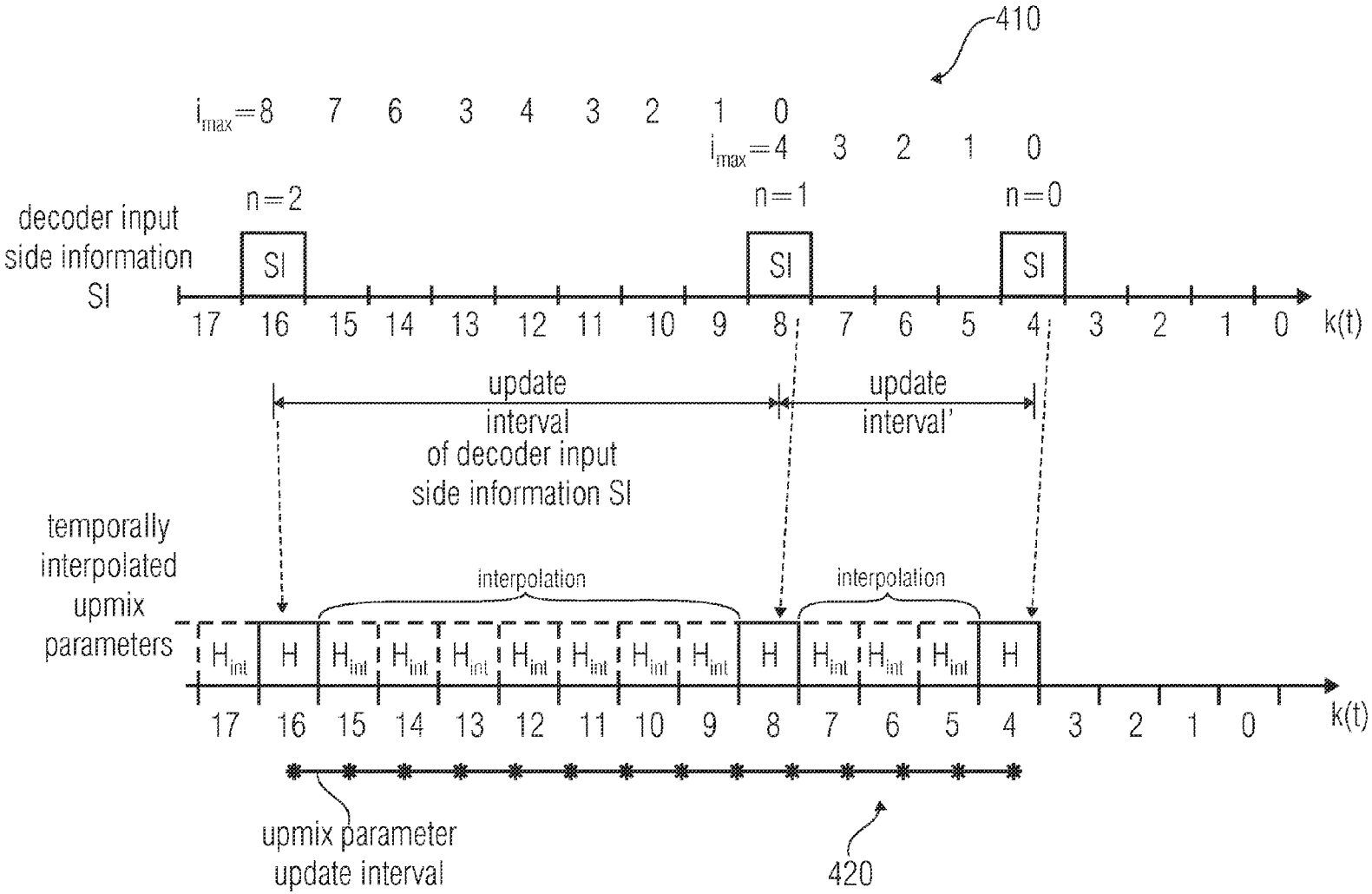
FIG. 4 shows a schematic representation of a timing relationship between the decoder input side information and temporally interpolated upmix parameters based thereon.

FIG. 4 shows a graphical representation of the timing relationship between the input information 212 (decoder input side information) received by the side information processing unit 250 and the output information 262 (complex-valued temporally interpolated upmix parameters) provided by the side information processing unit 252 to the upmixer 230.

FIG. 4 shows a graphical representation 410 of the decoder input side information 212. As can be seen from the graphical representation 410, the decoder input side information is not updated every audio sample update interval k, but only once per multiple of the audios sample update intervals k. In contrast, the temporally interpolated upmix parameters of the sequence 262, which are shown at reference numeral 420, are updated once per audio sample update interval. In other words, the update interval of the temporally interpolated upmix parameters 262 is, for example, identical to the audio sample update interval k. Thus, the matrix H can be updated once per audio sample update interval k.

Each audio sample may, therefore, be weighted with its associated (or even one-to-one associated) upmix parameter matrix H. While "exact" upmix parameter matrices, which are based on a single set of side information, may be provided for some of the audio sample update intervals (e.g. for k=4, 8, 16), interpolated upmix parameter matrices which are based on two, or even more, sets of side information are provided for other audio sample update intervals (e.g for k=5, 6, 7, 9, 10, 11, 12, 13, 14, 15).

Summary and Further Optional Improvements

In the following, the operation of the apparatus according to the present invention will be briefly summarized. Embodiments according to the present invention enhance current (or conventional) interpolation techniques by interpolation that preserves the signal's magnitude, also in the presence of time-variant phase changes for the parameters. For simplicity, the above description, and also the following description, restricts to an upmix from one to two channels only. Naturally, the concept could also be applied in the presence of a large number of downmix channels or upmixed channels.

The decoder's upmix procedure from, e.g., one to two channels is carried out by a matrix multiplication of a vector consisting of the downmix signal x (also designated with x(k)), called the dry signal, and a de-correlated version of the downmix signal q (also designated with q(k)), called the wet signal, with an upmix matrix H (also designated with H(k)). The wet signal q has been generated by feeding the downmix signal x through a de-correlation filter (e.g. the decorrelator 240). The output signal y is a vector containing the first and second channel of the output (for example components $y_1(k)$ and $y_2(k)$). All signals x, q, y may be available in a complex-valued frequency decomposition (e.g. time-frequency domain representation). This matrix operation is performed (for example separately) for subband samples of every frequency band. For instance, the matrix operation may be performed in accordance with the following equation:

$$\begin{bmatrix} y_1 \\ y_2 \end{bmatrix} = H \begin{bmatrix} x \\ q \end{bmatrix}$$

As can be seen from FIG. 2a, the matrix-vector multiplication may, for example, be performed by the matrix-vector multiplier 232 of the upmixer 230.

The coefficients of the upmix matrix H may be derived from the spatial cues, typically ILDs and ICCs, resulting in real-valued matrix elements that basically perform a mix of dry and wet signals for each channel based on the ICCs, and adjust the output levels of both output channels as determined by the ILDs.

When IPDs are used, an additional phase shift has to be applied to the signals to recreate the phase relation between channels of the original signal. The phase shift is performed by using complex-valued elements in the upmix matrix H, which results in a complex rotation of the subband signals, and thus a phase shift of these. The angle of the complex elements, when viewing them in polar coordinates, is equal to the necessitated phase shift.

Since parameters (also designated as "sets of side information", shown at reference numeral 212) are not transmitted for every audio sample (e.g. not for every audio sample update interval k), as has been described with reference to FIGS. 3 and 4, but only for a set of subsequent samples as a parameter-set, at each arrival of a parameter-set a new matrix $H_n$ is calculated.

Comparison Example

Linear Interpolation Approach

In the following, a possible linear interpolation approach will be described for the purpose of comparison. At sample points where no parameter-set is transmitted, a matrix (or interpolated matrix) $H_i$ can be calculated by linear interpolation of matrix elements between a (current) matrix $H_n$ and a previously calculated matrix $H_{n-1}$:

$$H_i=(1-i/i_{max})H_{n-1}+(i/i_{max})H_n,\ i=0 \ldots i_{max}$$

This linear interpolation of matrix elements works perfectly for real-valued elements. However, when using complex-valued elements with time-varying angles, this kind of interpolation has a clear drawback, as it results in an undesirable loss of output signal energy. The linear interpolation of two complex values results in a value with a smaller magnitude than the linear interpolation of the two magnitudes of the complex values would give. This fact is shown in FIG. 5.

Figure 5:
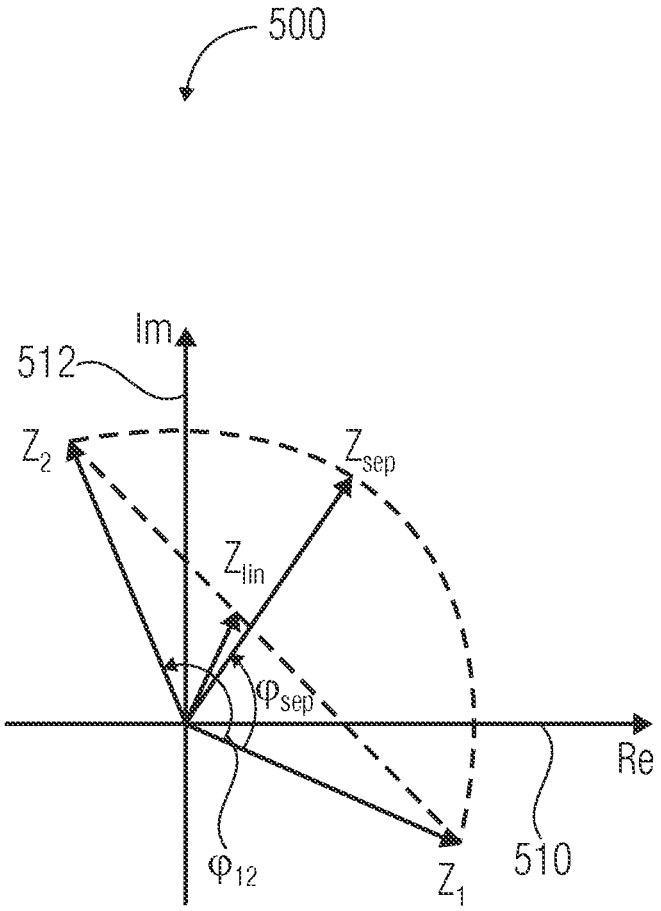
FIG. 5 shows a graphical representation of an interpolation path.

FIG. 5 shows a graphical representation 500 of different types of interpolation between two complex values. The graphical representation 500 describes complex numbers in a complex plane. An abscissa 510 serves as a real-part-axis and an ordinate 512 serves as an imaginary-part-axis. A first or initial complex value is designated with $z_1$, and a second or subsequent complex value is designated with $z_2$. A linear interpolation between the complex values $z_1$ and $z_2$ results in a complex value $z_{lin}$, with $z_{lin}=\frac{1}{2}(z_1+z_2)$. As can be seen, an absolute value (or magnitude value) of $z_{lin}$ is significantly lower than an absolute value of the complex value $z_1$ and also significantly lower than an absolute value of the complex value $z_2$.

However, apart from a simple formation of an average according to $\frac{1}{2}*(z\mathbf{1}+z\mathbf{2})$, a general linear implementation could alternatively be applied according to $$z_{lin}=(1-\alpha)*z_1+\alpha*z_2.$$

Regarding the linear interpolation, the reduction of the magnitude is getting higher with increasing angle of the two complex numbers ($z_1$ and $z_2$), with the worst case at 180 degrees. As the magnitudes of the complex matrix elements determine the amplitude of the output signal, this results in a lower output level for the samples between the subsequent parameter sets, than would be the case without using IPDs. This can result in audible modulation or dropout artifacts whenever a fast change of phase angle occurs.

Details Regarding the Separate Interpolation Approach

In the following embodiments of the separate interpolation of magnitude values and phase values will be described, wherein the separate interpolation is typically performed by the magnitude value interpolator 270 and the phase value interpolator 272.

To avoid the above described loss of output energy, a different method for interpolating the upmix matrix is proposed herein. This new method uses a separate interpolation for the matrix coefficients' angles obtained from the inter-channel phase differences (IPDs) and for their magnitudes obtained, for example, from the inter-channel level differences (ILDs) and inter-channel correlation or coherence (ICCs).

In a first step, real-valued matrix coefficients are calculated (e.g. represented by the sequence 254) and linearly interpolated (e.g. using the magnitude value interpolator 270), as it would be done without using inter-channel phase differences (IPDs).

In a next step, the phase shift angles (e.g. represented by the sequence 256) are computed from the transmitted inter-channel phase differences (IPDs) for the parameter sets (e.g. sets of side information 212). Between these angles, a linear interpolation is performed (e.g. using the phase-value interpolator 272) to obtain an angle for every sample between subsequent parameter sets (e.g. sets of side information 212). As angles are used in this interpolation which wrap around at $2\pi$, special care may be taken to interpolate into the right direction. For example, the interpolated angles can be obtained according to the following equation:

$$\alpha_i = \begin{cases} (1-i/i_{max})\alpha_{n-1} + (i/i_{max})\alpha_n & |\alpha_n - \alpha_{n-1}| \le \pi \\ ((1-i/i_{max})(\alpha_{n-1}+2\pi) + (i/i_{max})\alpha_n)\bmod 2\pi & \alpha_n - \alpha_{n-1} > \pi \\ ((1-i/i_{max})\alpha_{n-1} + (i/i_{max})(\alpha_n+2\pi))\bmod 2\pi & \alpha_n - \alpha_{n-1} < \pi \end{cases},$$

$$i = 0 \ldots i_{max}$$

In the above equation, $\alpha_{n-1}$ designates a phase value of a first (or previous) complex-valued upmix parameter. $\alpha_n$ designates a phase value of the second (or subsequent) complex-valued upmix parameter. "mod" designates a modulo-operator. i designates an index of an interpolated phase value. i=0 indicates an index associated with the first upmix parameter. $i=i_{max}$ designates an index associated with the second upmix parameter. Indices i between 0 and $i_{max}$ are associated with interpolated upmix parameters. In addition, it is assumed that there are $i_{max}-1$ interpolated values between two sampling points (or sets of side information).

Naturally, the order of the computation of the interpolated real-valued matrix coefficients and of the interpolated phase shift angles can be exchanged, or the computation can be performed in parallel.

In a last step, the real-valued matrix elements may be rotated by the interpolated angles. For example the following equation can be applied:

$$H_{xx,complex}=e^{j\alpha}H_{xx,real}$$

In the above equation "$_{xx}$" denotes the respective matrix element index (which is also sometimes designated with "$_{ij}$" herein). Further, $H_{xx,real}$ designates a real-valued matrix coefficient, i.e. a magnitude value. $\alpha$ designates a phase shift angle associated with the real-valued matrix coefficient $H_{xx,real}$. j designates the imaginary unit, i.e. square root of −1. $H_{xx,complex}$ designates a complex-valued upmix parameter.

By using the above described improved interpolation method the correct magnitude of the matrix elements is preserved.

In contrast to the linear interpolation approach described above, the separate magnitude value-phase value interpolation between the complex values $z_1$ and $z_2$ results in the interpolated value $z_{sep}$, as can be seen in FIG. 5. For example, the absolute value of the interpolated value $z_{sep}$ is determined by a linear interpolation between an absolute value of the first complex value $z_1$ and an absolute value of the second complex value $z_2$ (wherein |.| designates the absolute value operation). In addition, an angular position of the interpolated value $z_{sep}$ lies in between the angular positions of the first value $z_1$ and the second value $z_2$, as shown in FIG. 5.

Accordingly, it can be seen from FIG. 5 that the magnitude of the interpolated value $z_{sep}$ lies between the magnitudes of the first value $z_1$ and the second value $z_2$. Thus, the amplitude degradation, which can clearly be seen for the linear complex value interpolation (reduced magnitude of the linearly interpolated value $z_{lin}$ when compared to $z_1$ and $z_2$) is avoided by using a separate interpolation of magnitude and phase values.

CONCLUSION

To summarize the above, a general concept of producing interpolated upmix matrices (e.g. H), which are (at least approximately) magnitude preserving in the presence of time-varying phase synthesis has been described. Embodiments according to the invention supersede other techniques by reducing the amplitude loss in the output signal, caused by conventional simple interpolation techniques. Additionally, the computational effort for the magnitude preserving interpolation is only marginally higher than other techniques.

Method

Figure 6:
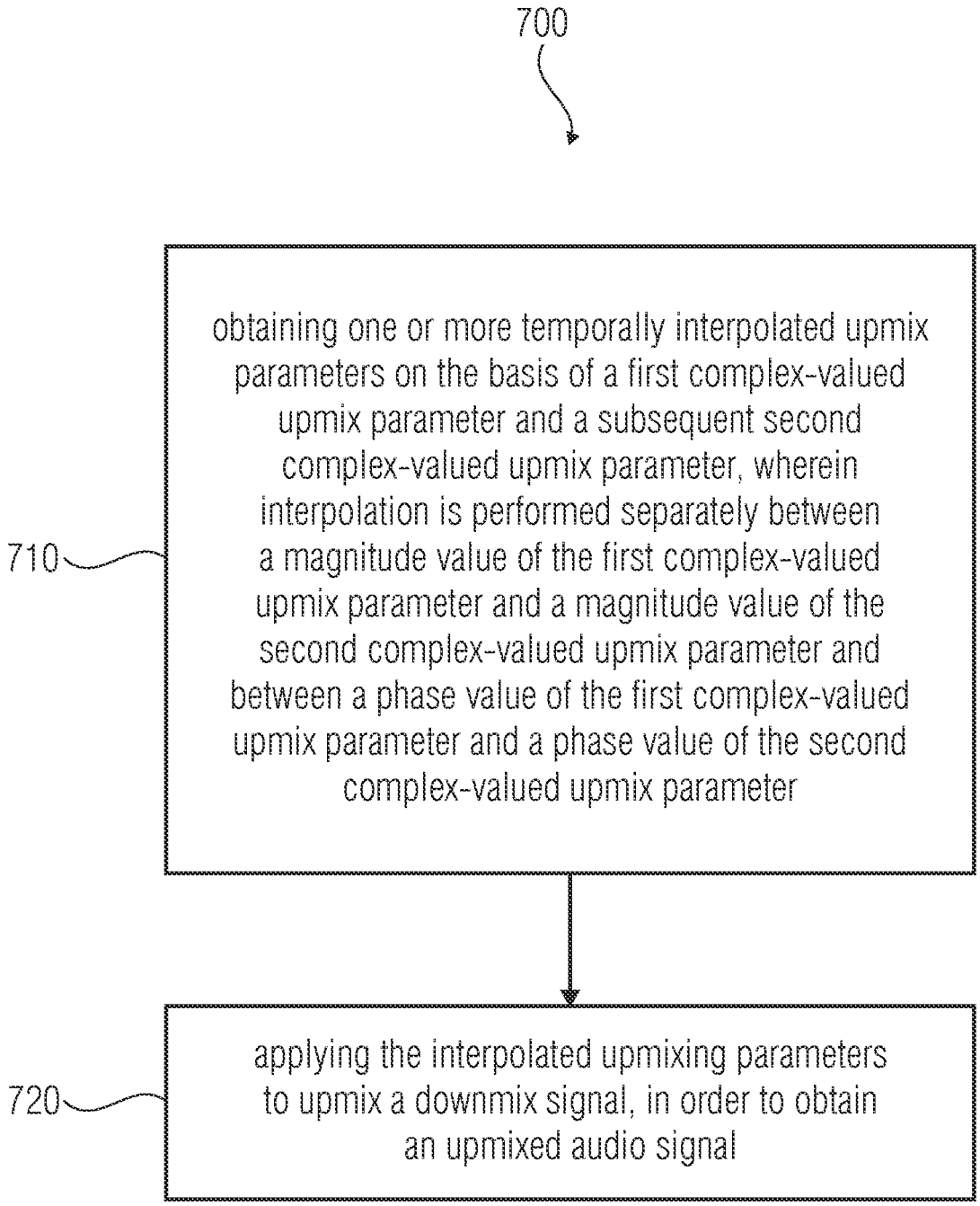
FIG. 6 shows a flow chart of a method for upmixing a downmix audio signal, according to an embodiment of the invention.

An embodiment according to the invention comprises a method for upmixing a downmix audio signal describing one or more downmix audio channels into an upmixed audio signal describing a plurality of upmixed audio channels. FIG. 6 shows a flow chart of such a method, which is designated in its entirety with 700.

The method 700 comprises a step 710 of obtaining one or more temporarily interpolated upmix parameters on the basis of a first complex-valued upmix parameter, and a subsequent second complex-valued upmix parameter. The interpolation is performed separately between a magnitude value of the first complex-valued upmix parameter and the magnitude value of the second complex-valued upmix parameter, and between a phase value of the first complex-valued upmix parameter and a phase value of the second complex-valued upmix parameter.

The method 700 further comprises the step 720 of applying the interpolated upmixing parameters to upmix a downmix signal, in order to obtain an upmixed audio signal.

The method 700 can be supplemented by any of the steps and functionalities described herein with respect to the inventive apparatus.

Different Implementation Technologies

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control Signals stored thereon, which cooperate (or are capable of cooperating) with a programmable computer System such that the respective method is performed.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium) comprising the computer program for performing one of the methods described herein.

A further embodiment of the inventive method is, therefore, a data stream or a sequence of signals representing the computer program for performing one of the methods described herein.

The data stream or the sequence of Signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein.

In some embodiments, a field programmable gate array may cooperate with a microprocessor in order to perform one of the methods described herein.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] C. Faller and F. Baumgarte, "Efficient representation of spatial audio using perceptual parameterization", IEEE WASPAA, Mohonk, N.Y., October 2001

[2] F. Baumgarte and C. Faller, "Estimation of auditory spatial cues for binaural cue coding", ICASSP, Orlando, Fla., May 2002

[3] C. Faller and F. Baumgarte, "Binaural cue coding: a novel and efficient representation of spatial audio," ICASSP, Orlando, Fla., May 2002

[4] C. Faller and F. Baumgarte, "Binaural cue coding applied to audio compression with flexible rendering", AES 113th Convention, Los Angeles, Preprint 5686, October 2002

[5] C. Faller and F. Baumgarte, "Binaural Cue Coding—Part II: Schemes and applications," IEEE Trans, on Speech and Audio Proc., vol. 11, no. 6, November 2003

[6] J. Breebaart, S. van de Par, A. Kohlrausch, E. Schuijers, "High-Quality Parametric Spatial Audio Coding at Low Bitrates", AES 116th Convention, Berlin, Preprint 6072, May 2004

[7] E. Schuijers, J. Breebaart, H. Purnhagen, J. Engdegard, "Low Complexity Parametric Stereo Coding", AES 116th Convention, Berlin, Preprint 6073, May 2004

[8] ISO/IEC JTC 1/SC 29/WG 11, 23003-1, MPEG Surround

[9] J. Blauert, Spatial Hearing: The Psychophysics of Human Sound Localization, The MIT Press, Cambridge, Mass., revised edition 1997

The invention claimed is:

[1. An apparatus for upmixing a downmix audio signal describing one or more downmix audio channels into an upmixed audio signal describing a plurality of upmixed audio channels, the apparatus comprising:

an upmixer configured to apply temporally variable upmix parameters to upmix the downmix audio signal in order to acquire the upmixed audio signal; and a parameter interpolator, wherein the parameter interpolator is configured to acquire one or more temporally interpolated upmix parameters to be used by the upmixer on the basis of an information describing a first complex-valued upmix parameter and a subsequent second complex-valued upmix parameter, wherein the parameter interpolator is configured to separately interpolate (a) between a magnitude value of the first complex-valued upmix parameter and a magnitude value of the second complex-valued upmix parameter, and (b) between a phase value of the first complex-valued upmix parameter and a phase value of the second complex-valued upmix parameter, to acquire the one or more temporally interpolated complex-valued upmix parameters.]

[2. The apparatus according to claim 1, wherein the parameter interpolator is configured to monotonically time-interpolate between the magnitude value of the first complex-valued upmix parameter and the magnitude value of the second complex-valued upmix parameter to acquire magnitude values of the one or more temporally interpolated upmix parameters, to linearly time-interpolate between the phase value of the first complex-valued upmix parameter and the phase value of the second complex-valued upmix parameter, to acquire phase values of the one or more temporally interpolated upmix parameters, and to combine the one or more interpolated magnitude values with one or more corresponding interpolated phase values, to acquire the one or more complex-valued temporally interpolated upmix parameters.]

[3. The apparatus according to claim 1, wherein the parameter interpolator is configured to linearly interpolate between the magnitude value of the first complex-valued upmix parameter and the magnitude value of the second complex-valued upmix parameter, to acquire interpolated magnitude values of the one or more temporally interpolated complex-valued upmix parameters.]

[4. The apparatus according to claim 1, wherein the upmixer is configured to perform a linear scaled superposition of complex-valued subband parameters of a plurality of upmixer audio input signals, in dependence on the complex-valued temporally interpolated upmix parameters to acquire the upmixed audio signal;

wherein the upmixer is configured to process sequences of complex-valued subband parameters representing subsequent audio samples of the upmixer audio input signals; and wherein the parameter interpolator is configured to receive a representation of subsequent complex-valued upmix parameters, which are temporally spaced by more than a duration of one of the audio samples, and to update the interpolated upmix parameters more frequently.]

[5. The apparatus according to claim 4, wherein the upmixer is configured to receive updated upmixer audio input signals at an upmixer update rate, and wherein the parameter interpolator is configured to update the interpolated upmix parameters at the upmixer update rate.]

[6. The apparatus according to claim 4, wherein the upmixer is configured to perform a matrix-vector multiplication using a matrix comprising the interpolated upmix parameters and a vector comprising the subband parameters of the upmixer audio input signals, to acquire, as a result, a vector comprising complex-valued subband parameters of the upmixed audio signals.]

[7. The apparatus according to claim 6, wherein the upmixer is configured to perform the matrix-vector multiplication using a real-part-imaginary-part number representation.]

[8. The apparatus according to claim 1, wherein the apparatus is configured to receive spatial cues describing the upmix parameters.]

[9. The apparatus according to claim 8, wherein the parameter interpolator is configured to determine the magnitude values of the interpolated upmix parameters in dependence on inter-channel level difference parameters, or in dependence on inter-channel correlation or coherence parameters, or in dependence on inter-channel level difference parameters and inter-channel correlation or coherence parameters; and to acquire phase values of the interpolated upmix parameters in dependence on inter-channel phase difference parameters or inter-channel time difference parameters.]

[10. The apparatus according to claim 1, wherein the upmixer is configured to apply the temporarily variable upmixing parameters to combine one or more downmix audio signals with one or more de-correlated versions of the one or more downmix audio signals.]

[11. The apparatus according to claim 1, wherein the parameter interpolator is configured to determine a direction of the interpolation between the phase values of subsequent complex-valued upmix parameters such that an angle-range passed in the interpolation between a phase value of the first complex-valued upmix parameter and a phase value of the second complex-valued upmix parameter is smaller than, or equal to, 180°.]

[12. The apparatus according to claim 1, wherein the parameter interpolator is configured to calculate an interpolated phase value $\alpha_i$ according to the following equation $$\alpha_i = \begin{cases} (1 - i/i_{max})\alpha_{n-1} + (i/i_{max})\alpha_n & |\alpha_n - \alpha_{n-1}| \le \pi \\ ((1 - i/i_{max})(\alpha_{n-1} + 2\pi) + (i/i_{max})\alpha_n)\bmod 2\pi & \alpha_n - \alpha_{n-1} > \pi \\ ((1 - i/i_{max})\alpha_{n-1} + (i/i_{max})(\alpha_n + 2\pi))\bmod 2\pi & \alpha_n - \alpha_{n-1} < -\pi \end{cases},$$

$i = 0 \ldots i_{max}$, wherein $\alpha_{n-1}$ designates a phase value of the first complex-valued upmix parameter;

$\alpha_n$ designates a phase value of the second complex-valued upmix parameter;

|.| designates an absolute value operator;

mod designates a modulo-operators; and i designates an index of an interpolated phase value, wherein i=0 designates an index associated with the first upmix parameter, wherein $i=i_{max}$ designates an index associated with the second upmix parameter, and wherein indices i between 0 and $i_{max}$ are associated with temporally interpolated upmix parameters.]

[13. The apparatus according to claim 1, wherein the parameter interpolator is configured to combine the separately interpolated magnitude values and phase values by applying a complex-valued rotation to the interpolated magnitude values, wherein an angle of the complex-valued rotation is determined by the interpolated phase values.]

[14. A method for upmixing a downmix audio signal describing one or more downmix audio channels into an upmixed audio signal describing a plurality of upmixed audio channels, the method comprising:

acquiring one or more temporally interpolated complex-valued upmix parameters on the basis of a first complex-valued upmix parameter and a subsequent second complex-valued upmix parameter, wherein the interpolation is performed separately (a) between a magnitude value of the first complex-valued upmix parameter and a magnitude value of the second complex-valued upmix parameter, and (b) between a phase value of the first complex-valued upmix parameter and a phase value of the second complex-valued upmix parameter; and applying the interpolated complex-valued upmix parameters to upmix the downmix audio signal, in order to acquire the upmixed audio signal.]

[15. A non-transitory computer readable medium including a computer program for performing a method, when the computer program runs on a computer, for upmixing a downmix audio signal describing one or more downmix audio channels into an upmixed audio signal describing a plurality of upmixed audio channels, the method comprising:

acquiring one or more temporally interpolated complex-valued upmix parameters on the basis of a first complex-valued upmix parameter and a subsequent second complex-valued upmix parameter, wherein the interpolation is performed separately (a) between a magnitude value of the first complex-valued upmix parameter and a magnitude value of the second complex-valued upmix parameter, and (b) between a phase value of the first complex-valued upmix parameter and a phase value of the second complex-valued upmix parameter; and applying the interpolated complex-valued upmix parameters to upmix the downmix audio signal, in order to acquire the upmixed audio signal.]

*16. An apparatus for upmixing a downmix audio signal describing one or more downmix audio channels into an upmixed audio signal describing a plurality of upmixed audio channels, the apparatus comprising:*

*an upmixer configured to apply temporally variable upmix parameters to upmix the downmix audio signal in order to acquire the upmixed audio signal; and*

*a parameter interpolator, wherein the parameter interpolator is configured to acquire one or more temporally interpolated upmix parameters to be used by the upmixer on the basis of an information describing a first complex-valued upmix parameter and a subsequent second complex-valued upmix parameter,*

*wherein the parameter interpolator is configured to separately interpolate*

*(a) between a magnitude value of the first complex-valued upmix parameter and a magnitude value of the second complex-valued upmix parameter, and*

*(b) between a phase value of the first complex-valued upmix parameter and a phase value of the second complex-valued upmix parameter,*

*to acquire the one or more temporally interpolated complex-valued upmix parameters;*

*wherein the upmixer is configured to perform a linear scaled superposition of complex-valued subband parameters of a plurality of upmixer audio input signals, in dependence on the complex-valued temporally interpolated upmix parameters to acquire the upmixed audio signal; and*

*wherein the apparatus for upmixing is implemented using a hardware apparatus, or using a computer, or using a combination of a hardware apparatus and a computer.*

*17. A method for upmixing a downmix audio signal describing one or more downmix audio channels into an upmixed audio signal describing a plurality of upmixed audio channels, the method comprising:*

*acquiring one or more temporally interpolated complex-valued upmix parameters on the basis of a first complex-valued upmix parameter and a subsequent second complex-valued upmix parameter,*

*wherein the interpolation is performed separately*

*(a) between a magnitude value of the first complex-valued upmix parameter and*

*a magnitude value of the second complex-valued upmix parameter, and*

*(b) between a phase value of the first complex-valued upmix parameter and a*

*phase value of the second complex-valued upmix parameter; and*

*applying the interpolated complex-valued upmix parameters to upmix the downmix audio signal, in order to acquire the upmixed audio signal;*

*wherein the method comprises performing a linear scaled superposition of complex-valued subband parameters of a plurality of upmixer audio input signals, in dependence on the complex-valued temporally interpolated upmix parameters to acquire the upmixed audio signal.*

*18. A non-transitory computer readable medium including a computer program for performing a method, when the computer program runs on a computer, for upmixing a downmix audio signal describing one or more downmix audio channels into an upmixed audio signal describing a plurality of upmixed audio channels, the method comprising:*

*acquiring one or more temporally interpolated complex-valued upmix parameters on the basis of a first complex-valued upmix parameter and a subsequent second complex-valued upmix parameter,*

*wherein the interpolation is performed separately*

*(a) between a magnitude value of the first complex-valued upmix parameter and*

*a magnitude value of the second complex-valued upmix parameter, and*

*(b) between a phase value of the first complex-valued upmix parameter and a*

*phase value of the second complex-valued upmix parameter; and*

*applying the interpolated complex-valued upmix parameters to upmix the downmix audio signal, in order to acquire the upmixed audio signal;*

*wherein the method comprises performing a linear scaled superposition of complex-valued subband parameters of a plurality of upmixer audio input signals, in dependence on the complex-valued temporally interpolated upmix parameters to acquire the upmixed audio signal.*

* * * * *